United States Patent
Kawabata et al.

[11] Patent Number: 5,997,641
[45] Date of Patent: Dec. 7, 1999

[54] SEED-CRYSTAL HOLDER FOR SINGLE-CRYSTAL PULLING DEVICES WITH MAGNETIC FIELD APPLIED THERETO

[75] Inventors: Mitsunori Kawabata; Yoshinobu Hiraishi; Mitsuo Usukubo; Ayumi Suda, all of Kanagawa, Japan

[73] Assignee: Komatsu Electronic Metals Co., Ltd., Kanagawa, Japan

[21] Appl. No.: 08/986,415

[22] Filed: Dec. 8, 1997

[30] Foreign Application Priority Data

Dec. 6, 1996 [JP] Japan .................................. 8-326640

[51] Int. Cl.[6] .................................................. C30B 35/00
[52] U.S. Cl. ............................. 117/218; 117/30; 117/32; 117/917
[58] Field of Search ................................ 117/30, 32, 200, 117/218, 917

[56] References Cited

U.S. PATENT DOCUMENTS

| | | | |
|---|---|---|---|
| 3,819,421 | 6/1974 | Merkeh et al. | 117/30 |
| 4,201,746 | 5/1980 | Burd et al. | 117/217 |
| 5,797,990 | 8/1998 | Li | 117/208 |
| 5,827,366 | 10/1998 | Watanabe | 117/202 |

FOREIGN PATENT DOCUMENTS

| | | | |
|---|---|---|---|
| 02018381A2 | 1/1990 | Japan . | |
| 5-11077 | 2/1993 | Japan | C30B 15/32 |
| 05058771A2 | 3/1993 | Japan . | |

*Primary Examiner*—Felisa Hiteshew
*Attorney, Agent, or Firm*—Sughrue, Mion, Zinn, Macpeak & Seas, PLLC

[57] ABSTRACT

The hold member has a small-diameter portion and a large-diameter portion. An inner cylinder and an outer cylinder are disposed around the hold member in a concentric manner. The upper end of the hold member is affixed to a wire and suspended therefrom. A clearance is formed between the small-diameter portion and the inner cylinder. Clearances are created between the outer peripheral surface of the inner cylinder and the inner peripheral surface of the outer cylinder.

10 Claims, 4 Drawing Sheets

SEED-CRYSTAL HOLDER FOR SINGLE-CRYSTAL PULLING DEVICES WITH MAGNETIC FIELD APPLIED THERETO

BACKGROUND OF THE INVENTION

1. Field of the Invention

This invention relates to a seed-crystal holder installed in single-crystal pulling devices, which is used for holding seed crystals while applying a magnetic field to a melted liquid, such as silicon melted liquid, and pulling single crystals therefrom.

2. Description of the Related Art

Conventionally, in the process of pulling single-crystal ingots such as silicon single-crystal ingots, a seed crystal 10 is brought into contact with melted liquid 6 and magnetic field is applied laterally to melted liquid 6 by means of the magnets 8, then the seed crystal 10 is rotated to pull the semiconductor ingot 60.

The essential requirements for a seed-crystal holder adapted to hold seed crystals are superior heat endurance and adequate weight. If it has not enough endurance, single crystal contaminated with the material of the seed crystal holder. If it is too light, it is not capable of obtaining a stable rotation of the seed crystal holder. Several materials such as molybdenum and graphite meet the above requirements. However, the drawback of such conductive materials as molybdenum and graphite is that a braking torque having a tendency to stop the rotation of the seed-crystal holder is produced along with the electric current induced by electromagnetic induction of magnetic field. The magnitude of the electric current induced depends on the magnetic-flux density of the magnet field, the rotation speed of the seed crystal, and the conductivity of the material of seed crystal holder. The higher magnetic-flux density, rotation speed and conductivity, the larger magnitude of the lectric current and the breaking torque.

There are several ways to overcome the brake torque problem, such as "SEED-CRYSTAL HOLDER FOR SINGLE-CRYSTAL PULLING DEVICES WITH MAGNETIC FIELD APPLIED THEREON" disclosed in EXAMINED JAPANESE PATENT PUBLICATION HEI 5-11077. The body of the seed-crystal holder is made of non-conductive materials such as ceramic, and thus electromagnetic induction is eliminated.

However, if the body of the seed-crystal holder is made of non-conductive materials such as ceramic whose specific gravity is less than that of molybdenum, then the weight of the seed-crystal holder becomes about ⅓ of that of a conventional one. Such light-weight seed-crystal holders is not applicable to handle the increased weight load resulting from the enlargement of the diameter of each semiconductor ingot, and steady rotation can not be obtained.

In other words, the cable for suspending the seed-crystal holder must be thicker accompanying with increased diameters of semiconductor ingots. If a light seed-crystal holder is installed on a cable that is thicker than conventional one, the cable can not be kept in the state of being vertically suspended. That is the cause of rotational wobbing of the seed crystal holder. Then, the ingot grown becomes bent, and it proves impossible to control of its diameter.

SUMMARY OF THE INVENTION

It is an object of the present invention to provide a seed-crystal holder for single-crystal pulling devices to which a magnetic field is applied, capable of handling the thicker suspension cable that is used as the diameters of semiconductor ingots increase so as to facilitate steady rotation.

To hold a seed crystal during the application of a magnetic field and pulling a single crystal, the seed-crystal holder installed in the single-crystal pulling device has a plurality of cylinders having diameters different from each other, and each of the cylinders is concentric to the rotation axis of the seed crystal so as to form a multiple layer structure.

Furthermore, to hold a seed crystal during the application of a magnetic field and the pulling a single crystal, the seed-crystal holder installed in the single-crystal pulling device has a plurality of disks, having a multiple layers structure, and the disks are piled each other so that a center of each disk corresponds to a rotation axis of the seed crystal.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Because conventional seed-crystal holders is not applicable to handle the larger-diameter semiconductor ingots, the seed-crystal holder according to this invention is designed to eliminate the brake torque so as to obtain a steady rotation of the seed crystal. The materials employed in the seed-crystal holders of this invention, just like those used in conventional ones, are metals with large specific gravities. The seed-crystal holder of this invention is shaped like a multiple layered structure of cylinders or disks so as to prevent the induction caused by the magnetic field.

The following is a description of embodiments of this invention with reference made to the drawings.

FIRST EMBODIMENT

Figure 1:
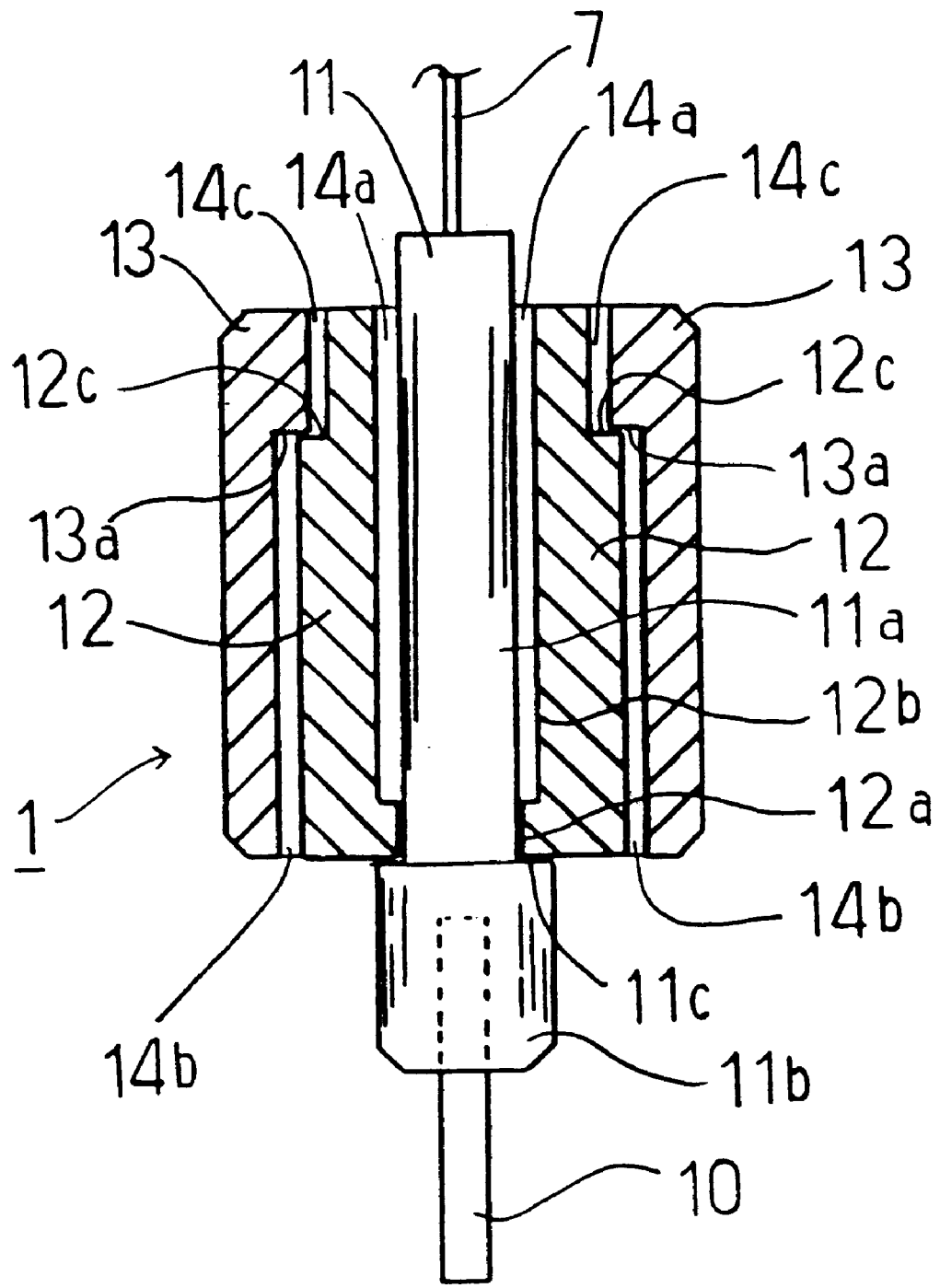
FIG. 1 is a partial cross-section side view of first embodiment of this invention.

FIG. 1 is a partial cross-section side view of First embodiment of this invention. As shown in FIG. 1, the seed-crystal holder 1 of this embodiment consists of a hold member 11 whose lower end is capable of holding a seed crystal 10; and an inner cylinder 12 and an outer cylinder 13 respectively disposed around the upper portion of the hold member 11 so as to form a concentric structure. The upper end of the hold member 11 is affixed to a wire 7 and suspended therefrom.

The hold member 11 has an upper small-diameter portion 11a and a lower large-diameter portion 11b. The inner cylinder 12 is disposed on a stepped surface 11c formed between the small-diameter portion 11a and the large-diameter portion 11b.

It is arranged such that only the lower inner peripheral surface 12a of the inner cylinder 12 is in contact with the outer peripheral surface of the small-diameter portion 11a. The diameter of the inner peripheral surface 12b located above the lower inner peripheral surface 12a is designed to be larger than that of the small-diameter portion 11a, and a clearance 14a is formed between the small-diameter portion 11a and the inner cylinder 12.

Furthermore, an inner-cylinder-engaging portion 12c is formed on the outer peripheral surface of the inner cylinder 12. An outer-cylinder-engaging portion 13a formed on the inner peripheral surface of the outer cylinder 13 is in contact with the inner-cylinder-engaging portion 12c and is held thereon. Except for the outer-cylinder-engaging portion 13a, the diameter of the inner peripheral surface of the outer cylinder 13 is formed to be longer than that of the outer peripheral surface of the inner cylinder 12, and clearances 14b and 14c are thus created.

The widths of the clearances 14a, 14b and 14c are set to be about 1 mm. For practical purposes, at least 0.05 mm is required to obtain a sufficient insulation.

A test result shows that a seed-crystal holder 1 of this invention weighing 7 kg could be driven to rotate smoothly and reached a rotation speed of 12 rpm in a magnetic field of flux density 4000 Gauss.

The following is a description concerning comparisons between rotation tests performed respectively in comparative examples described hereinafter and First embodiment of this invention.

FIRST COMPARATIVE EXAMPLE

A rotation test was performed by a seed-crystal holder made from molybdenum having the same weight as that of the above First embodiment and having a one-layer structure different from the laminated structure of this invention. The result shows that a seed-crystal holder weighing 7.2 Kg began to lose its rotation stability rotation at a rotation speed below 4 rpm in a magnetic field of flux density 4000 Gauss, and thus, pulling was difficult to perform.

SECOND COMPARATIVE EXAMPLE

Another rotation test was performed by a seed-crystal holder made from ceramic weighing only 2.4 kg and having the same shape as that of the above First embodiment. Due to the fact that the wire could not be suspended vertically, steady rotation could not be obtained from the outset of pulling.

SECOND EMBODIMENT

Figure 2:
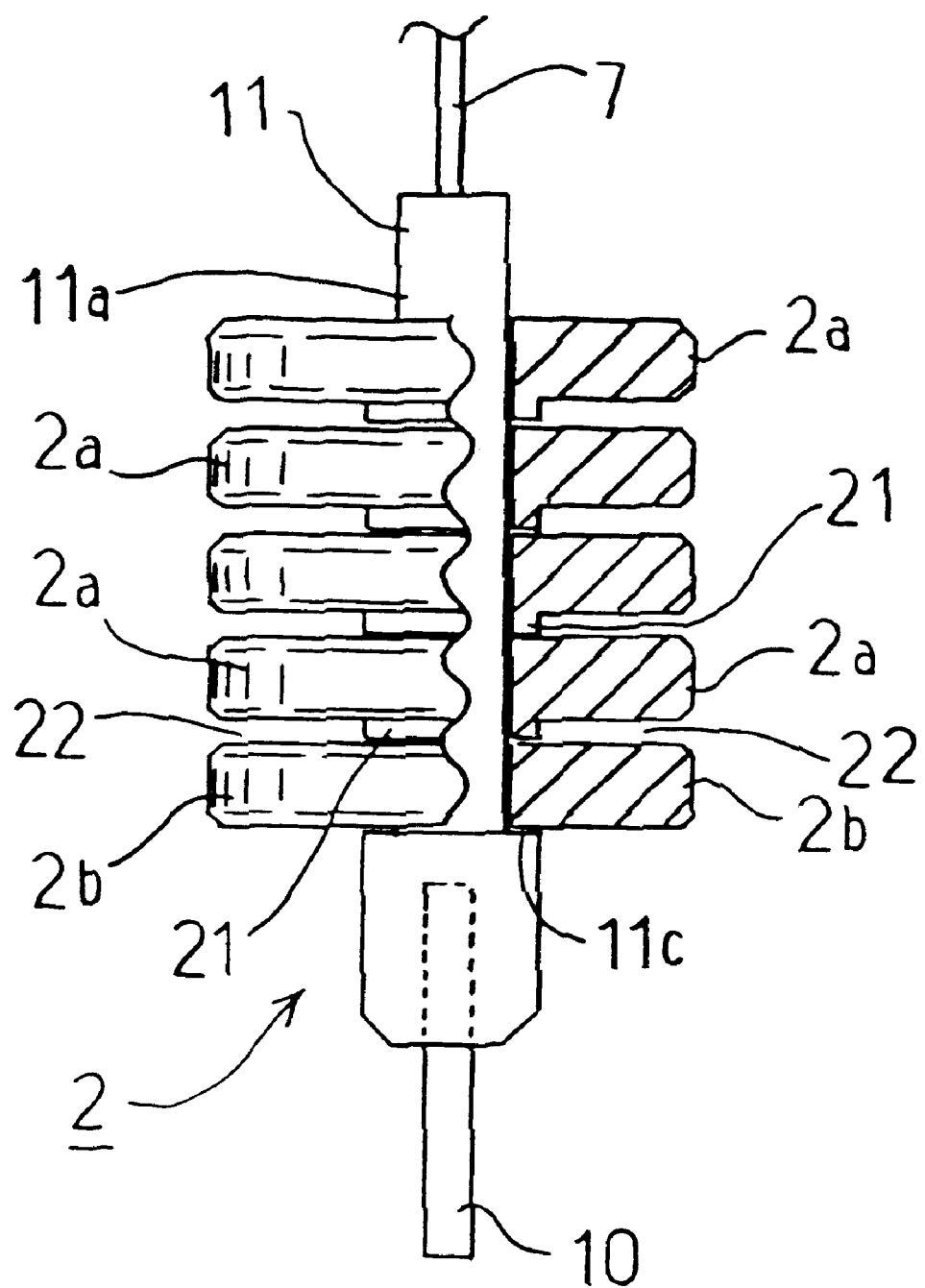
FIG. 2 is a partial cross-section side view of second embodiment of this invention.

FIG. 2 is a partial cross-section side view of Second embodiment of this invention. As shown in FIG. 2, in the seed-crystal holder 2 of this embodiment, the shape of the hold member 11 whose lower end is capable of holding a seed crystal 10 is the same as that of First embodiment. An undermost disk 2b is disposed on the hold member 11, then a plurality of disks 2a are overlaid thereon. Each disk is kept laid on a stepped surface 11c and is in the shape of a doughnut with its central portion penetrated by the small-diameter portion 11a of the hold member 11.

A ring-shaped protrusion 21 is formed on the bottom of each disk 2a, and clearances 22 are thus created. The induced electric current flowing along the rotational axis of the hold member 11 is substantially less due to the existence of clearances 22, and the rotation of the seed crystal 10 is not impeded. Thus, steady rotation can be obtained.

The widths of the clearances 22 are set to be about 1 mm. For practical purposes, at least 0.05 mm is required to obtain sufficient insulation.

A test result shows that a seed-crystal holder 2 weighing 7.2 kg could be driven to rotate smoothly and reached a rotation speed of 10 rpm in a magnetic field of flux density 4000 Gauss.

THIRD EMBODIMENT

Figure 3:
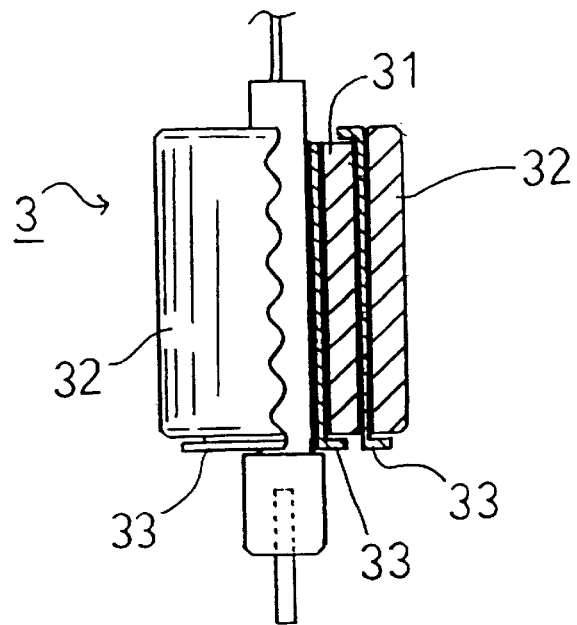
FIG. 3 is a partial cross-section side view of third embodiment of this invention.

FIG. 3 is a partial cross-section side view of Third embodiment of this invention. As shown in FIG. 3 and the same as in First embodiment, the seed-crystal holder 3 is provided with an inner cylinder 31 and an outer cylinder 32 of different diameters. Instead of the clearances in First embodiment, an insulator such as ceramic 33 is interposed between the inner cylinder 31 and the outer cylinder 32. With this arrangement, just like First embodiment, steady rotation of the seed-crystal 10 can be obtained.

A test result shows that a seed-crystal holder 3 weighing 7.1 kg could be driven to rotate smoothly and reached a rotation speed of 13 rpm in a magnetic field of flux density 4000 Gauss.

FOURTH EMBODIMENT

Figure 4:
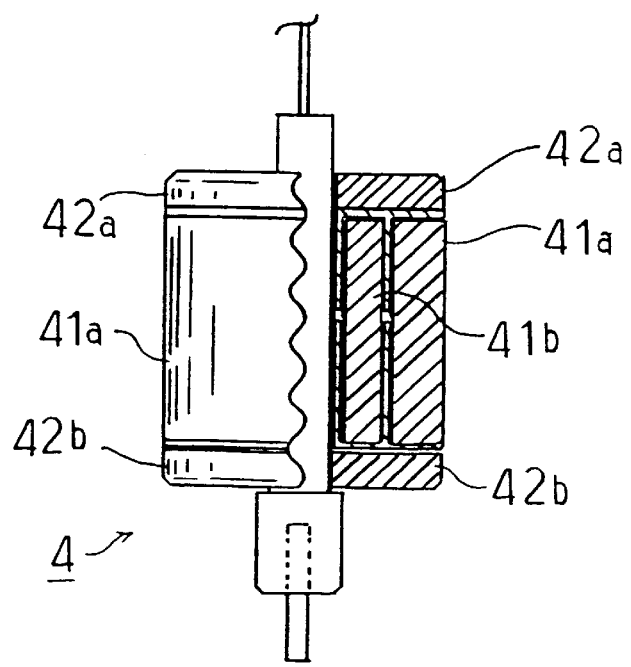
FIG. 4 is a partial cross-section side view of fourth embodiment of this invention.
Figure 5:
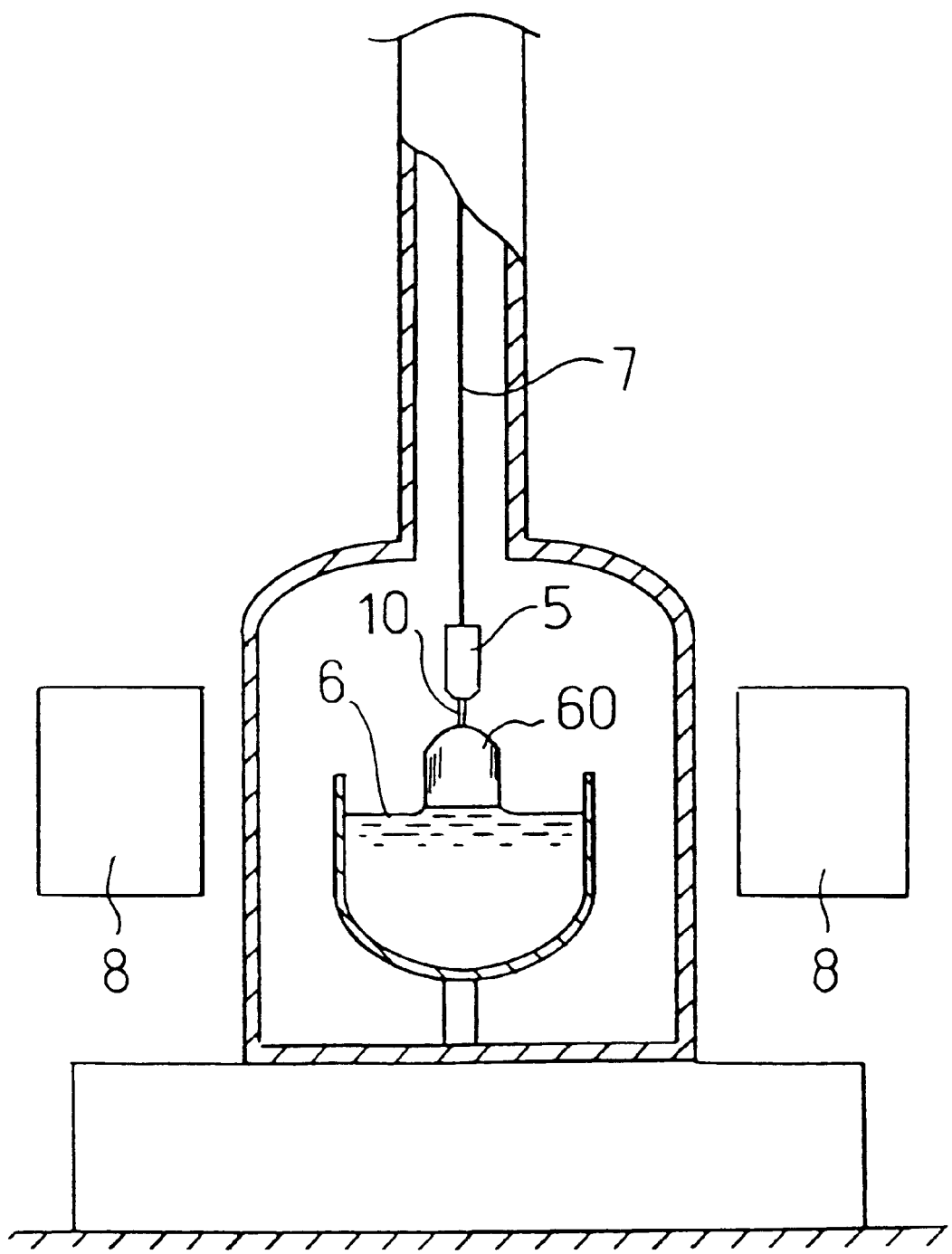
FIG. 5 is a schematic diagram showing a device for pulling single crystals.

FIG. 4 is a partial cross-section side view of Fourth embodiment of this invention. In First embodiment and Second embodiment, the overlaying of cylinders or disks creates clearances. However, it should not be limited to the above two embodiments, any means capable of creating clearances between those overlaid may obtain the same effect. Therefore, as shown in FIG. 4, the seed-crystal holder 4 of Fourth embodiment is assembled from the cylinders 41a, 41b and the disks 42a, 42b.

Furthermore, the materials employed in the seed-crystal holders of the above embodiments can be conductive. Therefore, metals that can easily be machined and have superior heat endurance could be used, and compared with conventional ones made of insulate ceramic, the seed-crystal holder of this invention can be manufactured at low cost. Metals such as molybdenum, tungsten, stainless steel, and inconel can also be adapted for such use.

The structure of this invention has been described as above. The seed-crystal holder of this invention can be made of metals such as molybdenum that can easily be machined and which have superior heat endurance, therefore a sufficient weight that is required for steady rotation can be obtained. Furthermore, currents induced by the application of magnetic fields can be minimized. Thus, it becomes possible to increase the diameters of semiconductor ingots.

What is claimed is:

1. A seed-crystal holder for a single-crystal pulling device, adapted for holding the seed crystal and being installed in a single-crystal pulling device to which a magnetic field is applied during the pulling of single crystals, comprising:
   a plurality of cylinders having diameters different from each other;
   wherein each of said cylinders is concentric to a rotation axis of the seed crystal so as to form a concentric multiple layers structure.

2. A seed-crystal holder for a single-crystal pulling device as claimed in claim 1, wherein clearances are formed between two neighboring cylinders.

3. A seed-crystal holder for a single-crystal pulling device as claimed in claim 1, wherein an insulating cylinder is interposed between two adjacent cylinders.

4. A seed-crystal holder for a single-crystal pulling device as claimed in claim 1, further comprising:
   a hold member having a lower end which holds the seed-crystal, the hold member being in a form such that its upper portion is of a small-diameter and its lower portion is of a large-diameter;

wherein the plurality of cylinders are disposed on a stepped surface between the small-diameter portion and the large-diameter portion.

5. A seed-crystal holder for a single-crystal pulling device as claimed in claim 1, wherein the cylinders are made of metals having heat endurance selected from the group of molybdenum, tungsten, stainless steel, and inconel.

6. A seed-crystal holder for a single-crystal pulling device, adapted for holding the seed crystal and being installed in a single-crystal pulling device to which a magnetic field is applied during the pulling of single crystals, comprising:

a plurality of disks having a multiple layers structures;

wherein said disks are piled each other so that a center of each disk corresponds to a rotation axis of the seed crystal.

7. A seed-crystal holder for a single-crystal pulling device as claimed in claim 6, wherein clearances are formed between two neighboring disks.

8. A seed-crystal holder for a single-crystal pulling device as claimed in claim 2, wherein an insulating disk is interposed between two adjacent disks.

9. A seed-crystal holder for a single-crystal pulling device as claimed in claim 2, further comprising:

a hold member having a lower end which holds the seed-crystal, the hold member being in a form such that its upper portion is of a small-diameter and its lower portion is of a large-diameter;

wherein the plurality of disks are disposed on a stepped surface between the small-diameter portion and the large-diameter portion.

10. A seed-crystal holder for a single-crystal pulling device as claimed in claim 2, wherein the disks are made of metals having heat endurance selected from the group of molybdenum, tungsten, stainless steel, and inconel.

* * * * *